(12) United States Patent
Petty-Weeks

(10) Patent No.: US 6,787,896 B1
(45) Date of Patent: Sep. 7, 2004

(54) SEMICONDUCTOR DIE PACKAGE WITH INCREASED THERMAL CONDUCTION

(75) Inventor: Sandra L. Petty-Weeks, Newport Beach, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

(21) Appl. No.: 10/438,968

(22) Filed: May 15, 2003

(51) Int. Cl.[7] .................................. H01l 23/053
(52) U.S. Cl. .............. 257/700; 257/706; 438/106; 438/118
(58) Field of Search ...................... 438/106, 123, 438/118, 107; 361/720, 704; 257/700, 706, 738

(56) References Cited

U.S. PATENT DOCUMENTS 6,201,701 B1 * 3/2001 Linden et al. .............. 361/720
6,477,046 B1 * 11/2002 Stearns et al. .............. 361/704

* cited by examiner

Primary Examiner—Long Pham
Assistant Examiner—Hoa B. Trinh
(74) Attorney, Agent, or Firm—Farjami & Farjami LLP

(57) ABSTRACT

In one exemplary embodiment, a structure comprises a substrate having a core, a top surface and a bottom surface. A substrate die pad is situated on the top surface of the substrate and is capable of receiving a die, and a heat spreader is situated on the bottom surface of the substrate. The substrate further comprises a first metal cap, at least one buried via, and a second metal cap. The first metal cap is situated below and is thermally coupled to the substrate die pad. The at least one buried via is situated below the first metal cap within the core of the substrate. The second metal cap is situated below the at least one buried via and is thermally coupled to the second metal cap.

23 Claims, 6 Drawing Sheets

SEMICONDUCTOR DIE PACKAGE WITH INCREASED THERMAL CONDUCTION

BACKGROUND OF THE INVENTION

1. Field of the Invention

The present invention is generally in the field of semiconductors. More specifically, the invention is in the field of semiconductor die packaging.

2. Related Art

During semiconductor packaging, dice are mounted onto a die pad fabricated on a surface of a substrate. After a die is mounted on the substrate, bond wires are used to electrically connect die bond pads located on the die to their corresponding substrate ground pads and substrate signal pads located on the substrate. Vias in the substrate provide a connection between the substrate die pad and a heat spreader situated on a bottom surface of the substrate. This connection may also have an electrical function. Vias also provide a connection between substrate signal pads to corresponding substrate signal lands situated on the bottom surface of the substrate.

An important function carried out by the substrate is that of dissipating heat generated by the die during operation. A multilayer substrate is desirable because it allows increased circuit design flexibility; however, this can also increase the path required for thermal conduction, which decreases the heat dissipating ability of the package. In general, the substrate provides a thermal conduction path away from the die by way of the substrate die pad through vias connecting the substrate die pad to the heat spreader, and through the heat spreader to, for example, a printed circuit board ("PC board" or "PCB"). However, due to the arrangement of conventional substrates as well as the fabrication process associated with conventional substrates, the thermal conduction path through the semiconductor package is severely limited. By way of example, thermal conduction is particularly limited in multi-layer substrates, such as four-layer substrates. As a consequence of inefficient thermal conduction, heat dissipation is severely limited and, therefore, semiconductor devices using such packages can suffer from poor performance and poor package reliability. Moreover, this problem is exacerbated where Gallium Arsenide (GaAs) dice are used. GaAs die have a much lower thermal conductivity (45 W/mK) compared to Si (160 W/mK) and, as a result, the thermal conduction inefficiency of conventional packages presents even more of a problem for GaAs devices.

Accordingly, there is a strong need in the art for a packaging structure and method which provides increased thermal conduction. More particularly, there is a need in the art for a packaging structure and method which provides increased thermal conduction in a multi-layer substrate.

SUMMARY OF THE INVENTION

The present invention is directed to a semiconductor die package with increased thermal conduction. The invention overcomes the need in the art for a structure which provides increased thermal conduction in a semiconductor die package and, in particular, in a semiconductor die package with a multi-layer substrate.

In one exemplary embodiment, a structure comprises a multilayer substrate having a core, a top surface and a bottom surface. A substrate die pad is situated on the top surface of the substrate and is capable of receiving a die, and a heat spreader is situated on the bottom surface of the substrate. The substrate die pad and the heat spreader may also perform electrical functions. The substrate further comprises at least one buried via within the core. The at least one buried via is situated below a first metal cap, and a second metal cap is situated below the at least one buried via. In one embodiment, the diameter of the at least one buried via is approximately 100–200 microns, and the length of the at least one buried via is approximately 100–200 microns. In one particular embodiment, the at least one buried via is plated with a metal barrel, where, for example, the thickness of the metal barrel is approximately 15–50 microns.

The first metal cap is thermally coupled to the substrate die pad, and the second metal cap is thermally coupled to the heat spreader. In one particular embodiment, the first and second metal caps comprise copper. With this arrangement, the at least one buried via provides a connection between the substrate die pad and the heat spreader which results in substantially increased thermal conduction between the substrate die pad and the heat spreader due to the shorter thermal conduction path through the at least one buried via while maintaining a multilayer structure on the remaining substrate area.

According to one exemplary embodiment, the substrate further comprises a first intermediate metal layer and a second intermediate layer. The first intermediate layer is situated between and thermally couples the first metal cap and the at least one buried via, and the second intermediate metal layer is situated between and thermally couples the at least one buried via and the second metal cap. The first intermediate metal layer and the first metal cap appear as and are indistinguishable in function from a single metal layer. Likewise, the second intermediate metal layer and the second metal cap appear as and are indistinguishable in function from another single metal layer.

According to one embodiment, the present invention is a method for fabricating the above described exemplary semiconductor die packaging structure. Other features and advantages of the present invention will become more readily apparent to those of ordinary skill in the art after reviewing the following detailed description and accompanying drawings.

DETAILED DESCRIPTION OF THE INVENTION

Figure 1A:
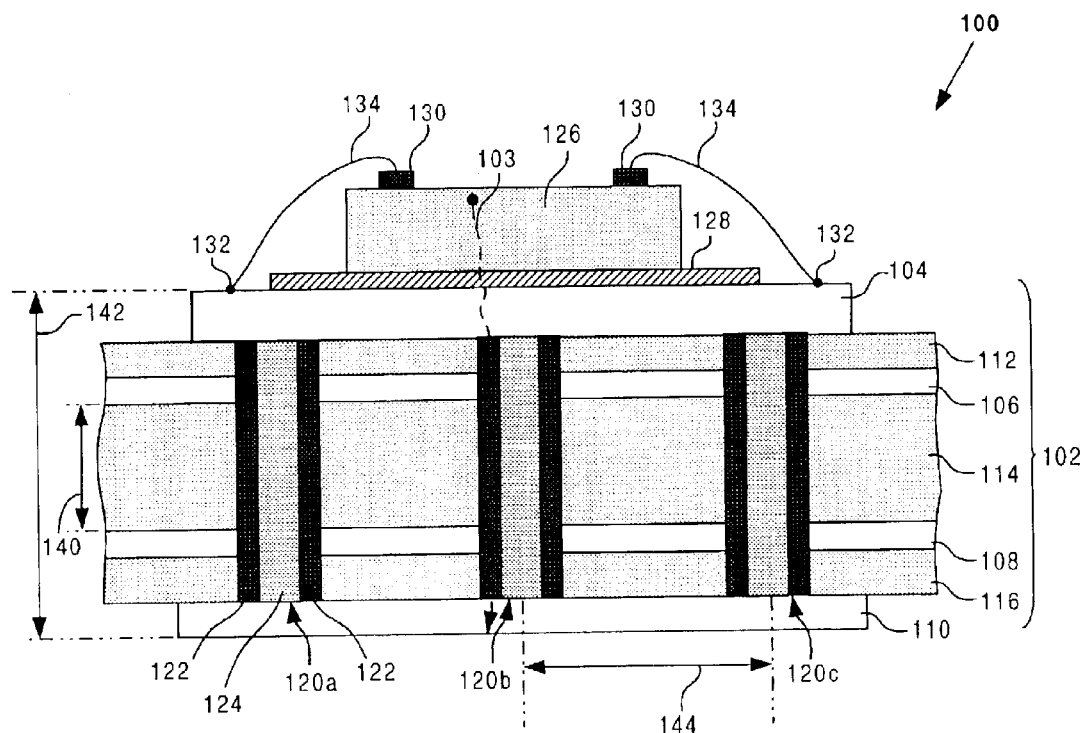
FIG. 1A illustrates a cross-sectional view of a known semiconductor die packaging structure.

The present invention is directed to a semiconductor die package with increased thermal conduction. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It is noted that, for ease of illustration, the various elements and dimensions shown in the drawings are not drawn to scale.

To illustrate the features and advantages of the present invention by way of contrast, a brief description of known semiconductor die packaging structure 100 in FIG. 1A is provided. FIG. 1A shows a cross-sectional view of structure 100 comprising die 126 mounted on substrate 102. Substrate 102 has substrate die pad 104 fabricated on its top surface, and adhesive 128 is used to attach die 126 to substrate die pad 104.

In the present example, substrate 102 is a four-layer substrate comprising metal layers 104, 106, 108 and 110. In FIG. 1A, substrate die pad 104 is fabricated in metal layer 104, and heat spreader 110 is fabricated metal layer 110. Substrate 102 also comprises top dielectric layer 112, core dielectric layer 114, and bottom dielectric layer 116, where each of layers 112, 114 and 116 comprises, for example, a resin dielectric material. Thickness 140 of core dielectric layer 114 is typically about 100–200 microns ($\mu$m), while thickness 142 of substrate 102 is typically about 350–450 $\mu$m.

Figure 1B:
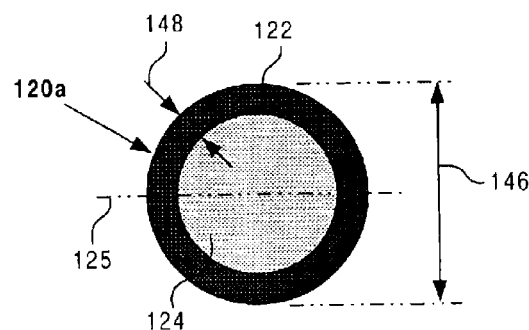
FIG. 1B illustrates a top view of an exemplary via in the structure of FIG. 1A.

Die 126 has a number of die bond pads 130 on its top surface. Bond wires 134 are used to electrically connect die bond pads 130 to substrate bond pads on substrate 102. In FIG. 1A, bond wires 134 connect die bond pads 130 to landing areas 132 on substrate die pad 104, where landing areas 132 function as substrate ground pads. Vias 120a, 120b and 120c are fabricated in substrate 102. As shown in FIG. 1A, each via 120a, 120b and 120c comprises a plated through hole (PTH), where the inner surface of each via 120a, 120b and 120c is plated with metal barrel 122 and the center of each barrel 122 is filled with resin 124. FIG. 1B shows a top view of via 120a, where cross-sectional view of via 120a in FIG. 1A is along line 125. Vias 120b and 120c are configured similar to via 120a as described below with respect to FIG. 1B. Thickness 148 of barrel 122 is typically about 15–50 $\mu$m, and via diameter 146, due to certain limitations as described below, is typically about 200–250 $\mu$m.

Vias 120a, 120b and 120c provide a connection between substrate die pad 104 and heat spreader 110. Of particular significance is the thermal conduction provided by vias 120a, 120b and 120c from substrate die pad 104 to heat spreader 110. For example, thermal path 103 indicates an exemplary heat transfer path for a hot spot originating from die 126, conducting through structure 102 for dissipation by heat spreader 110. Due to the particular arrangement of structure 100 and the limits imposed by fabrication of structure 100, however, thermal conduction from substrate die pad 104 to heat spreader 110 through structure 100 is considerably inefficient.

A significant factor which results in the thermal conduction inefficiency of structure 100 is the length of the heat conduction path through vias 120a, 120b and 120c which corresponds directly with the length of vias 120a, 120b and 120c. The longer the heat conduction path is through vias 120a, 120b and 120c, the less effective structure 100 is at conducting heat from substrate die pad 104 to heat spreader 110. As shown in FIG. 1, vias 120a, 120b and 120c extend from substrate die pad 104 to heat spreader 110. In this case, the length of the heat conduction path through vias 120a, 120b and 120c generally corresponds to thickness 142 of substrate 102, and for multi-layer structures such as structure 100, this heat conduction path is particularly lengthy (approximately 350–450 $\mu$m), resulting in poor thermal conduction through structure 100.

As a further adverse consequence of the length of vias 120a, 120b and 120c through substrate 102, limits are imposed upon the fabrication of vias 120a, 120b and 120c, which further reduce the thermal conduction efficiency of structure 100. For example, due to manufacturing constraints, via diameter 146 and the number of vias 120a, 120b and 120c that can be positioned below substrate die pad 104 are severely constrained. One such manufacturing constraint is via aspect ratio, which is defined by the ratio of via length to via diameter before plating, and requires minimum via diameter 146 for a given via length. Thus, due to the considerable length of each via 120a, 120b and 120c, large via diameter 146 (typically about 200–250 $\mu$m) is required for each via. 120a, 120b and 120c. Large via diameter 146 results in a reduced number of vias 120a, 120b and 120c that can be positioned below substrate die pad 104, particularly since pitch 144, corresponding to the distance between the centers of adjacent vias, is dependent on via diameter 146. A larger via diameter 146 results in a larger pitch 144, limiting the number of vias that can be located underneath die 126 for thermal conduction. This limitation imposed upon the number of vias 120a, 120b and 120c that can be positioned below substrate die pad 104 effectively limits the size of the heat transfer path between substrate die pad 104 and heat spreader 110, resulting in even less efficient thermal conduction through structure 100.

Figure 2:
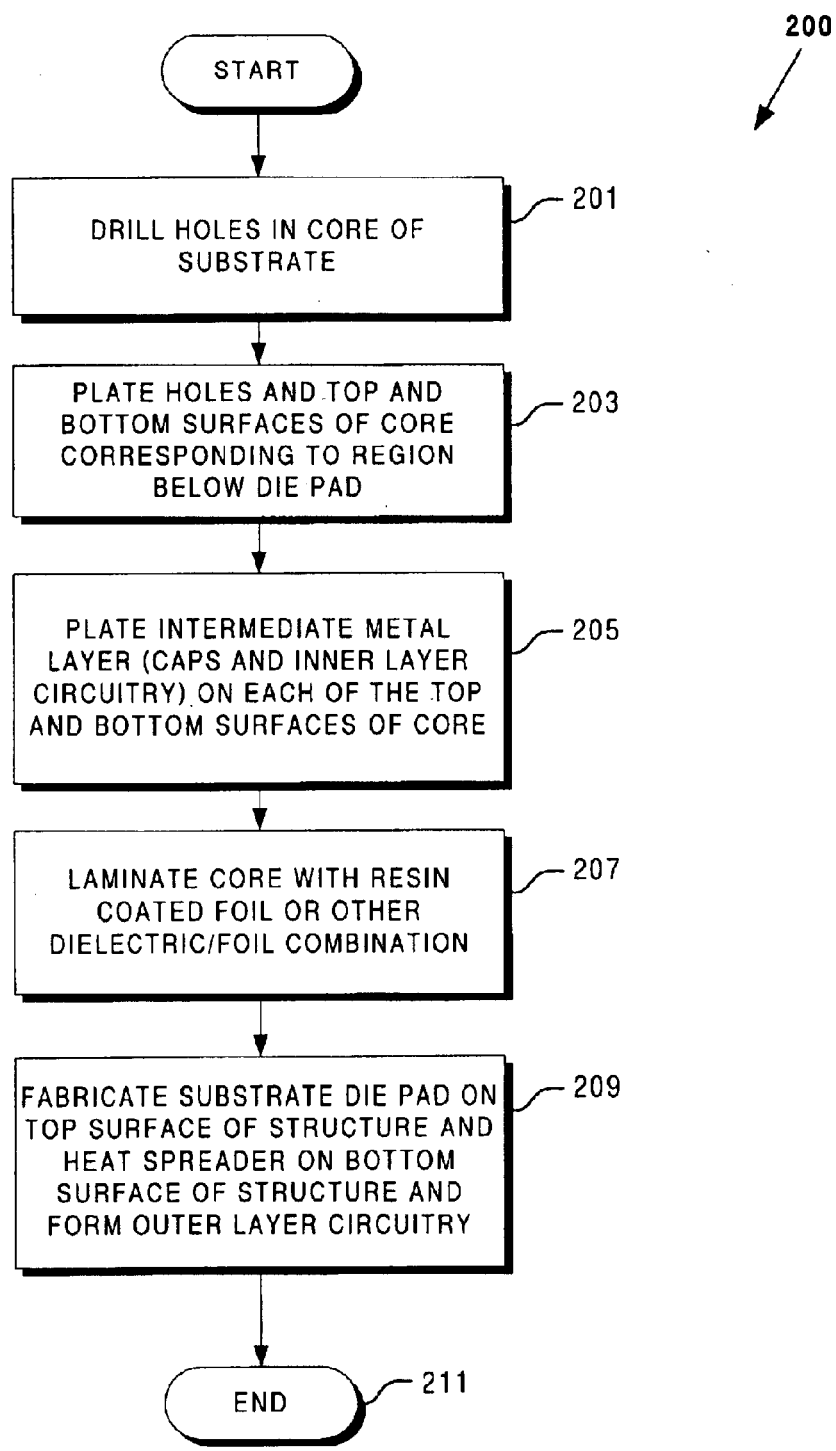
FIG. 2 illustrates a flowchart of an exemplary process by which an embodiment of the present invention is fabricated.

FIG. 2 shows flowchart 200 which describes the steps, according to one embodiment of the invention, in fabricating a packaging structure having increased thermal conduction. Certain details and features have been left out of flowchart 200 which are apparent to a person of ordinary skill in the art, for example, a step may consist of one or more substeps or may involve specialized equipment, as is known in the art. While steps 201 through 211 indicated in flowchart 200 are sufficient to describe one embodiment of the present invention, other embodiments of the invention may use steps different from those shown in flowchart 200. Referring to FIGS. 3A, 3B, 3C, 3D, and 3F, each of structures 301, 303, 305, 307, and 309 illustrates the result of performing steps 201, 203, 205, 207, and 209, respectively, of flowchart 200 of FIG. 2. For example, structure 301 shows the result of performing step 201; structure 303 shows the result of performing step 203: and so forth.

Figure 3A:
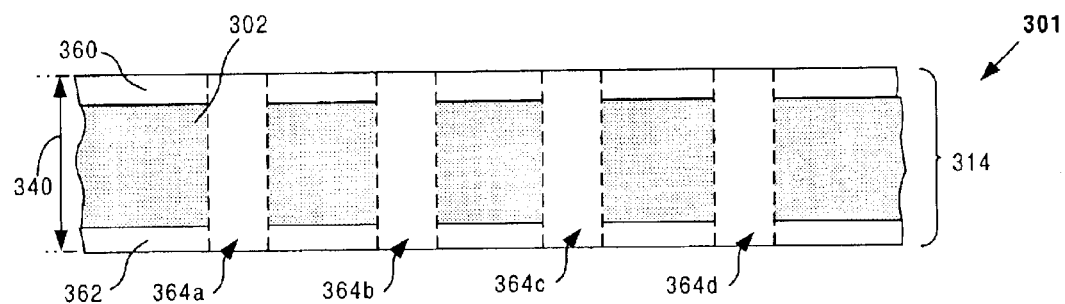
FIG. 3A illustrates a cross-sectional view, which includes portions of an exemplary structure fabricated according to an embodiment of the invention and a corresponding process step of the flowchart of FIG. 2.

Referring first to FIG. 2 and FIG. 3A, the result of step 201 of flowchart 200 is illustrated by structure 301. FIG. 3A shows core 314 which comprises dielectric layer 302, such as a mixture of epoxy resin and glass, for example, sandwiched between metal layers 360 and 362. At step 201, holes 364*a*, 364*b*, 364*c* and 364*d* are drilled through core 314. Thickness 340 of core 314 is approximately 100–200 μm.

Figure 3B:
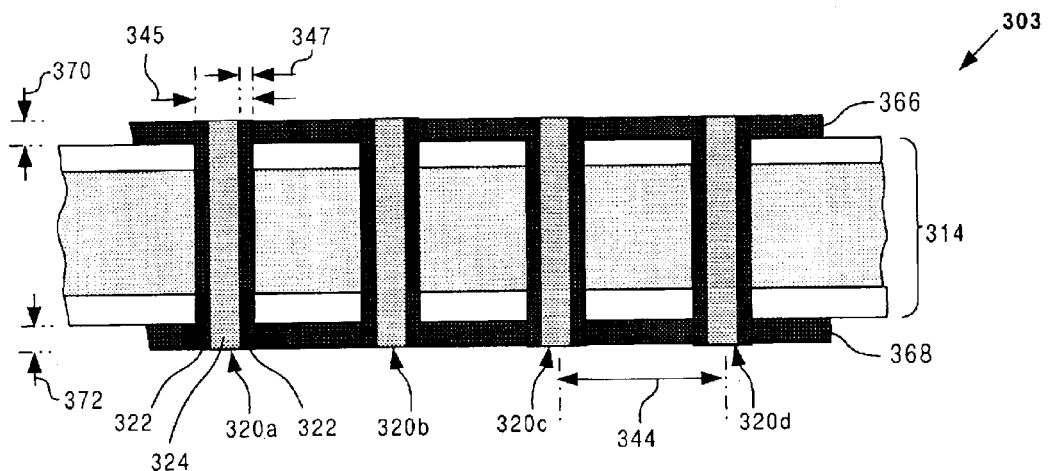
FIG. 3B illustrates a cross-sectional view, which includes portions of an exemplary structure fabricated according to an embodiment of the invention and a corresponding process step of the flowchart of FIG. 2.

Continuing with FIG. 2 and FIG. 3B, the result of step 203 of flowchart 200 is illustrated by structure 303. Step 203 comprises plating the inner surface of holes 364*a*, 364*b*, 364*c* and 364*d* to form via barrels 322 of vias 320*a*, 320*b*, 320*c* and 320*d*. Step 203 also comprises plating the top and bottom surfaces of core 314 with intermediate metal layers 366 and 368, respectively. In the present exemplary embodiment, thicknesses 370 and 372 of intermediate metal layers 366 and 368, respectively, are approximately 10–50 μm, which can be decreased by further processing, if desired. Although not shown, either or both intermediate metal layers 366 and 368 may further comprise features, such as circuitry or trace, for signal routing. Portions of core 314 may be protected from plating by a temporary plating mask or other means. Alternatively, the circuitry on intermediate metal layers 366 and 368 is also patterned and plated during this step and protected during a subsequent plating step, e.g., step 205 in FIG. 2. Also during step 203, vias 320*a*, 320*b*, 320*c* and 320*d* are filled with resin 324. In the present application, vias 320*a*, 320*b*, 320*c* and 320*d*, will also be referred to as "buried vias." Buried vias 320*a*, 320*b*, 320*c* and 320*d* may be plated over and capped during later fabrication steps.

Continuing with reference to FIG. 3B, length of each buried via 320*a*, 320*b*, 320*c* and 320*d* in structure 303 is significantly reduced when compared to known structure 100 of FIG. 1A. In FIG. 3B, for example, length of each buried via 320*a*, 320*b*, 320*c* and 320*d* corresponds to thickness of core 314, and is approximately 100–200 μm, whereas in FIG. 1, length of each via 120*a*, 120*b* and 120*c* is approximately 350–450 μm. This reduced length significantly improves heat transfer out of the semiconductor package. An added benefit of the reduced length of each buried via 320*a*, 320*b*, 320*c* and 320*d*, is that via diameter 345 of each buried via 320*a*, 320*b*, 320*c* and 320*d* can also be significantly reduced while maintaining the same aspect ratio for via plating. In one embodiment, via diameter 345 is approximately 100–200 μm. With a reduction in via diameter 345, an increased number of buried vias 320*a*, 320*b*, 320*c* and 320*d* can be positioned below the substrate die pad (not yet fabricated in FIG. 3B), which effectively improves the heat transfer path through substrate 302. Thickness 347 of barrel 322 is typically about 15–50 μm, and pitch 344, corresponding to the distance between the centers of adjacent vias, can be considerably decreased.

Figure 3C:
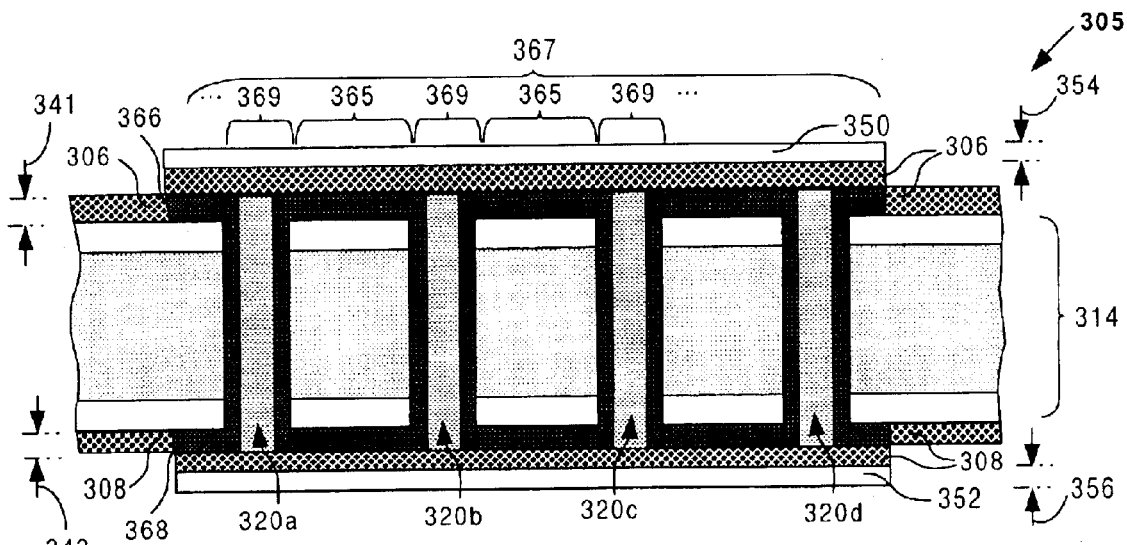
FIG. 3C illustrates a cross-sectional view, which includes portions of an exemplary structure fabricated according to an embodiment of the invention and a corresponding process step of the flowchart of FIG. 2.

Continuing with FIG. 2 and FIG. 3C, the result of step 205 of flowchart 200 is illustrated by structure 305. Step 205 comprises plating over the top and bottom surfaces of structure 303 (FIG. 3B) with intermediate metal layers 306 and 308. Intermediate metal layer 306 comprises copper, for example, and plates the top surface of core 314 and intermediate metal layer 366; intermediate metal layer 308 may also comprise copper and plates the bottom surface of core 314 and intermediate metal layer 368. In the present exemplary embodiment, thicknesses 341 and 343 of intermediate metal layers 306 and 308, respectively, are about 10–35 μm, which can be decreased by further processing, if desired. Although not shown, either or both of intermediate metal layers 306 and 308 may further comprise features, such as circuitry or traces, for signal routing.

Step 207 further comprises fabricating metal caps 350 and 352 over the surface of each intermediate metal layer 306 and 308, respectively, in region 367. Region 367 of substrate 302 corresponds to area below which the die attach will later be fabricated. Metal caps 350 and 352 comprise a metal, such as copper, and may be fabricated over layers 306 and 308, respectively, using temporary plating masks, for example. By way of example, thicknesses 354 and 356 of metal caps 350 and 352, respectively, are in the range of about 25 to 35 μm.

Metal caps 350 and 352 can further be subdivided into two types. The first type corresponds to metal fabricated over regions 365 associated with the areas above and below dielectric portion of core 314 within region 367. The second type corresponds to metal fabricated over regions 369 associated with the areas above and below vias 320*a*, 320*b*, 320*c* and 320*d*. In the particular embodiment shown in FIG. 3C, metal caps 350 and 352 are fabricated over both regions 365 and 369 to form contiguous caps occupying region 367, although in other embodiments metal caps 350 and/or 352 may be fabricated in only one of regions 365 and 369 within region 367. As described more fully below, metal caps 350 and 352 operate to displace dielectric material during subsequent lamination steps, and also to form a metal bridge for thermal and electrical conduction between substrate die pad (not yet fabricated) and intermediate metal layer 306 and between heat spreader (not yet fabricated) and intermediate metal layer 308, respectively.

Figure 3D:
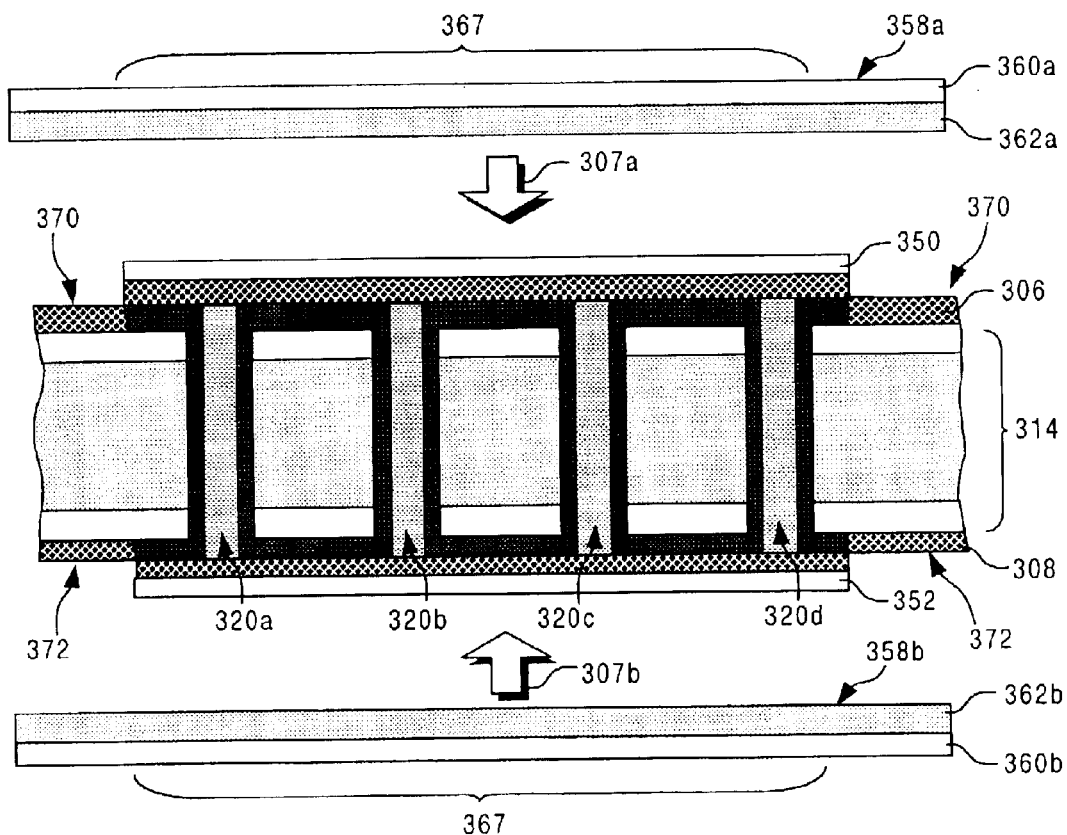
FIG. 3D illustrates a cross-sectional view, which includes portions of an exemplary structure fabricated according to an embodiment of the invention and a corresponding process step of the flowchart of FIG. 2.
Figure 3E:
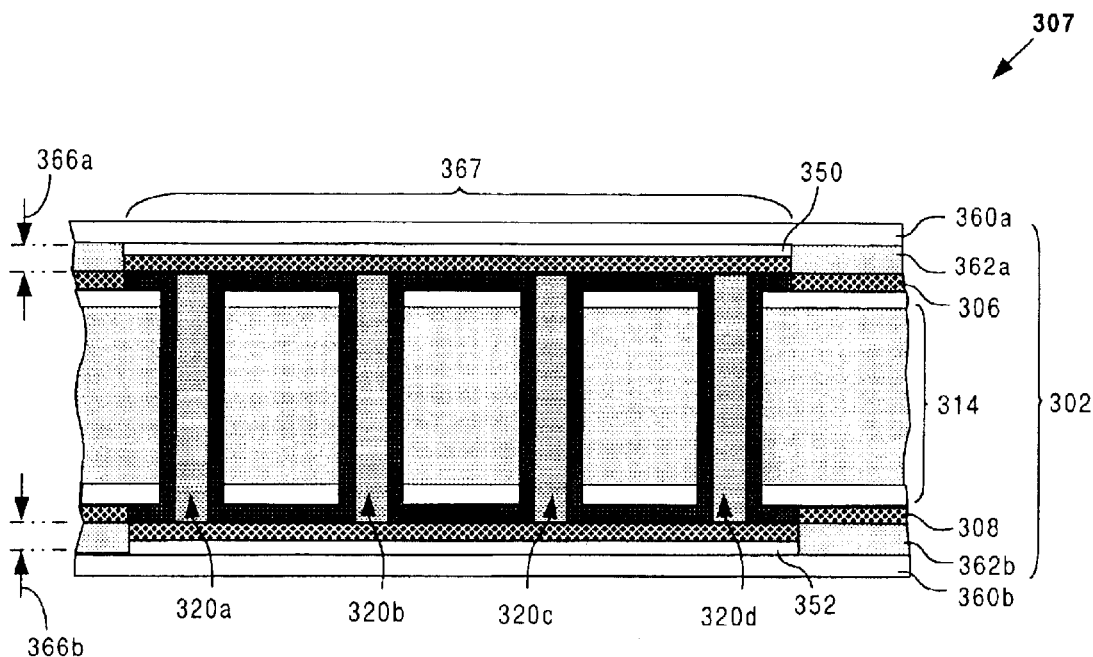
FIG. 3E illustrates a cross-sectional view, which includes portions of an exemplary structure fabricated according to an embodiment of the invention and a corresponding process step of the flowchart of FIG. 2.

Continuing with FIG. 2 and FIGS. 3D and 3E, the process of step 207 of flowchart 200 is illustrated by operations 307*a* and 307*b* in FIG. 3D, and the result of step 207 of flowchart 200 is illustrated by structure 307 in FIG. 3E. Step 209 comprises laminating over metal caps 350 and 352 and exposed areas 370 and 372 of intermediate metal layers 306 and 308, respectively. During lamination operation 307*a*, resin coated foil 358*a*, which comprises copper foil 360*a* and dielectric 362*a*, such as a B stage resin, is applied with sufficient pressure over metal cap 350 and exposed areas 370 of intermediate metal layer 306 so that dielectric 362*a* is displaced by metal cap 350 in region 367, and copper foil 360*a* directly contacts metal cap 350 as shown in resulting structure 307 in FIG. 3E. Similarly, during lamination operation 307*b*, resin coated foil 358*b*, which comprises copper foil 360*b* and dielectric 362*b*, such as a B stage resin, is, applied with sufficient pressure over metal cap 352 and exposed areas 372 of intermediate metal layer 308 so that dielectric 362*b* is displaced by metal cap 352 in region 367, and copper foil 360*b* directly contacts metal cap 352 as shown in resulting structure 307 in FIG. 3E. Typically, lamination steps 307*a* and 307*b* occur concurrently. Other types of dielectrics may be laminated with copper foil to yield the same results.

In FIG. 3E, structure 307 results in a metal bridge comprising metal cap 350 for thermal and electrical conduction between copper foil 360*a* (copper foil 360*a* is later formed into a substrate die pad and can be referred to as "top metal layer" 360*a*) and intermediate metal layer 306. Metal cap 352 functions as a metal bridge for thermal and electrical conduction between copper foil 360*b* (copper foil 360*b* is later formed into a heat spreader and can be referred to as "bottom metal layer" 360b) and intermediate metal layer 308. As described further below, this arrangement in conjunction with the fabrication of shorter and/or a greater number of smaller diameter buried vias 320a, 320b, 320c and 320d substantially increases thermal conduction between top metal layer 360a and bottom metal layer 360b. Significantly, metal caps 350 and 352 are fabricated in substrate 302 to displace dielectrics 362a and 362b, respectively, during lamination, rather than by forming metal caps 350 and 352 by drilling or otherwise excavating dielectric 362a and 362b from region 367, and then subsequently depositing metal into the drilled or excavated space. This technique results in a cost-effective process for fabricating substrate 302 and related completed structure 31 shown in FIG. 3F. By way of example, thickness 366a of dielectric 362a and metal cap 350 is typically in the range of approximately 25 to 50 μm, and thickness 366b of dielectric 362b and metal cap 352 is also typically in the range of approximately 25 to 50 μm.

Figure 3F:
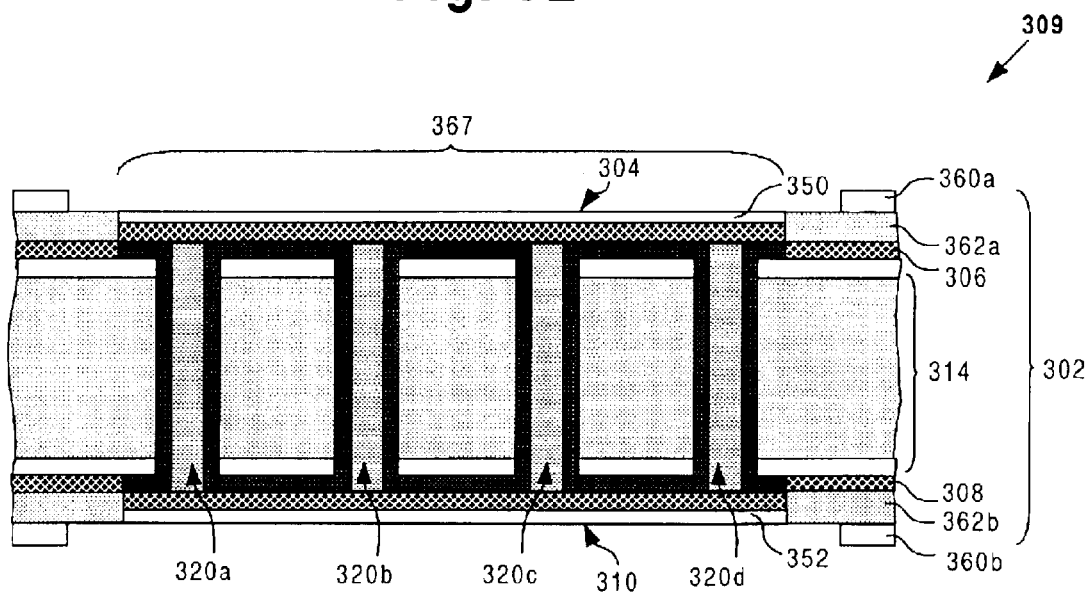
FIG. 3F illustrates a cross-sectional view, which includes portions of an exemplary structure fabricated according to an embodiment of the invention and a corresponding process step of the flowchart of FIG. 2.

Referring now to FIG. 2 and FIG. 3F, the result of step 209 of flowchart 200 is illustrated by structure 309. Step 209 comprises fabricating substrate die pad 304 on top surface of substrate 302 and heat spreader 310 on bottom surface of substrate 302. Substrate die pad 304 and heat spreader 310 can be fabricated, for example, by masking and etching top metal layer 360a and bottom layer 360b of structure 309 in FIG. 3F. Further processing steps are also typically performed to prepare substrate die pad 304 for receiving a die, such as surface cleaning and/or additional plating. Although not shown to preserve brevity, substrate signal pads and substrate signal lands are also fabricated on the top and bottom surfaces, respectively, of substrate 302. Additional fabrication processes may also be performed, such as fabricating circuitry and/or traces, on the top and/or bottom surfaces of substrate 302 outside the substrate die pad area.

Structure 309 provides significantly increased thermal conduction from substrate die pad 304 to heat spreader 310 for dissipating heat generated by a die (not shown) mounted on substrate 302. These particular features are illustrated with reference to exemplary structure 400 in accordance with one embodiment of the present invention shown in FIG. 4, where substrate 402, substrate die pad 404, metal cap 450, dielectric 462a, intermediate metal layer 406, core 414, buried vias 420a, 420b, 420c and 420d, intermediate metal layer 408, metal cap 452, dielectric 462b, and heat spreader 410 respectively correspond to substrate 302, substrate die pad 304, metal cap 350, dielectric 362a, intermediate metal layer 306, core 314, buried vias 320a, 320b, 320c and 320d, intermediate metal layer 308, metal cap 352, dielectric 362b, and heat spreader 310 in structure 311 in FIG. 3F. The multilayer portion of substrate 402 comprising the remainder of the circuitry is not shown for clarity.

Structure 400 may be used in conjunction with packaging die 426. By way of example, die 426 may be a GaAs power amplifier die suitable for use in wireless devices, such as mobile telephones. Die 426 is attached to substrate die pad 404 with die attach adhesive 428. In the particular embodiment shown in FIG. 4, die attach adhesive 428 thermally and electrically connects die 426 to substrate die pad 404. A number of die bond pads 430 are situated on the top surface of die 426. Electrical connection between die bond pads 430 and substrate bond pad are made by way of bond wires 434. For example, one end of each bond wire 434 is bonded to respective die bond pad 430, and the other end of each bond wire 434 is bonded to respective substrate landing area 432 of substrate die pad 404 for providing a ground connection.

Figure 4:
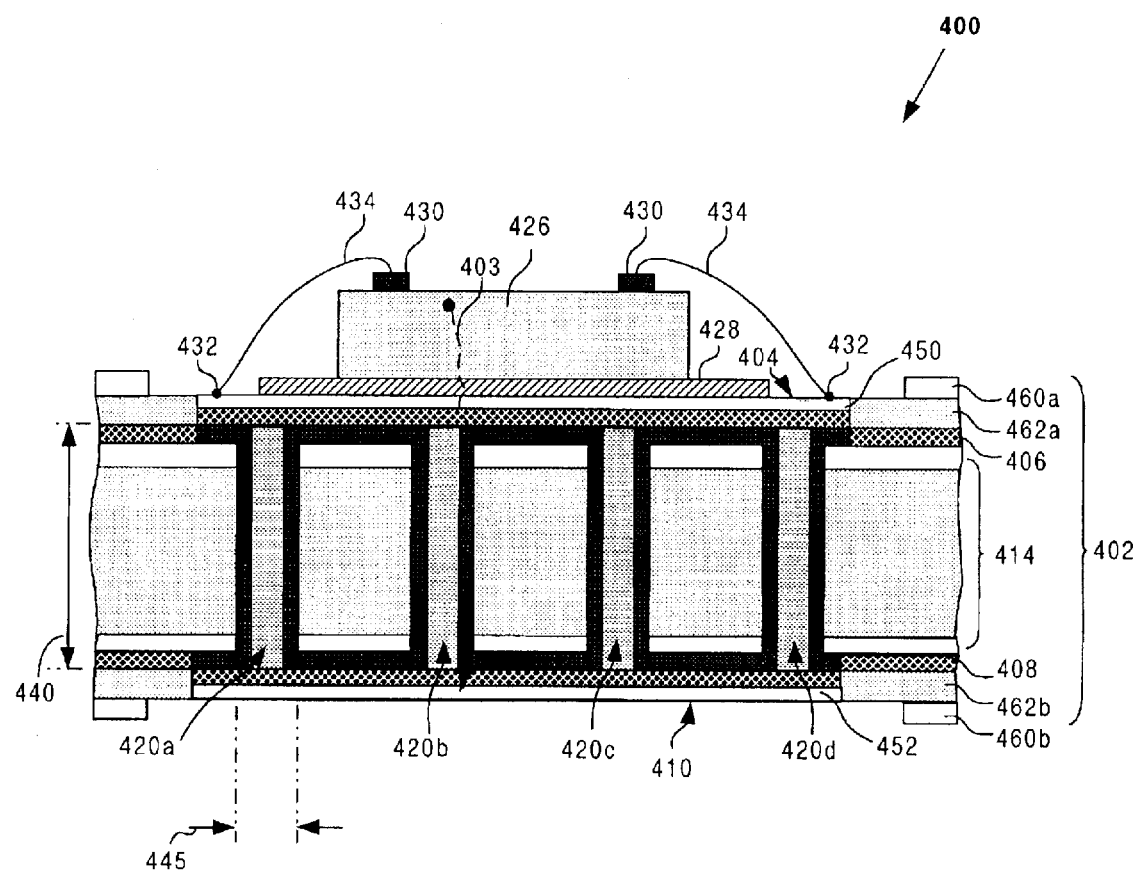
FIG. 4 illustrates a cross-sectional view of an exemplary structure in accordance with one embodiment of the present invention.

In this particular arrangement, the regions of substrate die pad 404 proximate landing areas 432 function as "substrate ground pads." Although not shown in FIG. 4 to preserve brevity, bond wires may also be used to connect die bond pads to their corresponding substrate bond pads for providing signal and/or power connections.

Due to the particular arrangement of structure 400, thermal conduction from substrate die pad 404 to heat spreader 410 is greatly improved. A significant feature of structure 400 is reduced length 440 of buried vias 420a, 420b, 420c and 420d. For example, length 440 of buried vias 420a, 420b, 420c and 420d is approximately 100–200 μm in FIG. 4, whereas in FIG. 1, length of vias 120a, 120b and 120 generally corresponds to thickness of substrate 102, which is typically about 350–450 μm. Due to shorter buried vias 420a, 420b, 420c and 420d, heat transfer through substrate 402 is greatly improved. This increased thermal conduction is achieved even for multi-layer substrates, such as substrate 402 since this structure shortens the thermal conduction path compared to more conventional structures as shown in FIG. 1. In addition, metal cap 450 provides a metal bridge between substrate die pad 404 (corresponding to the top metal layer) and intermediate metal layer 406, and metal cap 452 provides a metal bridge between heat spreader 410 (corresponding to the bottom metal layer) and intermediate metal layer 408. Thus, substrate die pad 404, metal cap 450 and intermediate metal layer 406 effectively function as a single metal layer greatly improving thermal conduction between substrate die pad 404 and intermediate metal layer 406. Likewise, heat spreader 410, metal cap 452 and intermediate metal layer 408 effectively function as a single metal layer greatly improving thermal conduction between heat spreader 410 and intermediate metal layer 408. Thus, thermal path 403 is substantially more efficient at conducting heat originating from die 426 through structure 402 for dissipation by heat spreader 410.

Another feature of structure 400 which greatly increases thermal conduction from substrate die pad 404 and die bond pad 404 to heat spreader 410 is the increased number of buried vias that can be placed under the substrate die pad as a result of reducing via diameter 445 of each buried via 420a, 420b, 420c and 420d. As described above, via diameter 445 of each buried via 420a, 420b, 420c and 420d can be reduced as a result of the reduced length 440 of each buried via 420a, 420b, 420c and 420d. Accordingly, a greater number of buried vias 420a, 420b, 420c and 420d can be provided below substrate die pad 404 for thermal and electrical conduction between substrate die pad 404 and die 426 to heat spreader 410. As a result, the overall heat transfer path through substrate 402 is greatly increased, thereby further improving thermal conduction efficiency through substrate 402. Alternatively, due to the reduced aspect ratio, buried via diameter 445 can remain unchanged and additional metal plating added to the barrel of vias 420a, 420b, 420c and 420d, also greatly improving heat transfer out of the package. This improved thermal conduction efficiency of structure 400 is particularly advantageous for use with GaAs dice, which have reduced thermal conductivity and can therefore greatly benefit from the increased thermal conduction provided by structure 400.

According to yet another feature of the invention, metal caps 450 and 452 are fabricated by displacing dielectric 462a and 462b, respectively, during lamination processes. As described above, this technique avoids expensive and/or specialized manufacturing costs. In sum, structure 411 provides significantly increased thermal conduction in a cost-effective manner, and is particularly advantageous for use with GaAs dice and multi-layer substrates.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest that in one embodiment, the number of metal layers within substrates 302 and 402 may be modified without departing from the scope and spirit of the invention. The described exemplary embodiments are to be considered in all respects as illustrative and not restrictive. For example, in one embodiment, the final structure in FIG. 3F can also be arrived at by other means, such as by using a limited flow dielectric, such as W. L. Gore Microlam 600 series dielectrics, which may be a composite containing a "B stage dielectric resin" in an inert matrix. The portions around substrate die pad 304 and heat spreader 310 can be removed before lamination. It is noted that conventional resin coated foils and prepregs (glass fabric impregnated with B stage resin) are not suitable for this purpose. The steps preceding lamination (shown in FIGS. 3A through 3D) would be similar. Also, the final structure shown in FIG. 3F can be achieved without performing some of the intermediate plating steps, such as step 205, in FIG. 2. It should also be understood that the invention is not limited to the particular exemplary embodiments described herein, but is capable of many rearrangements, modifications, and substitutions without departing from the scope of the invention.

Thus, a semiconductor die package with increased thermal conduction has been described.

What is claimed is:

1. A structure comprising:
   a multilayer substrate having a core and a core thickness, a top surface and a bottom surface;
   a substrate die pad situated on said top surface of said substrate;
   a heat spreader situated on said bottom surface of said substrate, said substrate further comprising a first metal cap, al least one buried via, and a second metal cap, said first metal cap situated below and thermally coupled to said substrate die pad, said at lest one buried via situated below said first metal cap and within said core, said second metal cap situated below said at least one buried via and thermally coupled to said heat spreader, said at least one buried via providing a connection between said substrate die pad and said heat spreader;
   said at least one buried via having a length substantially corresponding to said core thickness.

2. The structure of claim 1, wherein said substrate further comprises:
   a first intermediate metal layer situated between and thermally coupling said first metal cap and said at least one buried via; and
   a second intermediate metal layer situated between and thermally coupling said at least one buried via and said second metal cap.

3. The structure of claim 2, wherein said substrate further comprises:
   a third layer situated between said substrate die pad and said first intermediate metal layer, said first metal cap occupying a portion of said third layer; and
   a fourth layer situated between said beat spreader and said second intermediate metal layer, said second metal cap occupying a portion of said fourth layer.

4. The structure of claim 3, wherein at least a portion of each of said core, said third layer and said fourth layer further comprises a dielectric.

5. The structure of claim 1, wherein said first and second metal caps comprise copper.

6. The structure of claim 1, wherein a diameter of said at least one buried via is approximately 100–200 microns.

7. The structure of claim 1, wherein a length of said at least one buried via is approximately 100–200 microns.

8. The structure of claim 1, wherein an inner surface of said at least one buried via is plated with a metal barrel.

9. The structure of claim 1, wherein a thickness of said metal barrel is approximately 15–50 microns.

10. A method for fabricating a structure for receiving a semiconductor die, said method comprising steps of:
    fabricating a substrate having a core and a core thickness, a top surface and a bottom surface;
    forming a substrate die pad on said top surface of said substrate;
    forming a heat spreader on said bottom surface of said substrate;
    forming at least one buried via in said core of said substrate;
    forming a first metal cap situated below and thermally coupled to said substrate die pad, said first metal cap situated above said at least one buried via; and
    forming a second metal cap situated below said at least one buried via, said at least one buried via providing a connection between said substrate die pad and said heat spreaders;
    said at least one buried via formed with a length substantially corresponding to said core thickness.

11. The method of claim 10, further comprising laminating over said first metal cap with a first laminating material comprising a first resin coated foil layer, thereby causing said first foil layer to directly contact said first metal cap.

12. The method of claim 11, further comprising laminating over said second metal cap with a second laminating material comprising a second resin coated foil layer, thereby causing said second foil layer to directly contact said second metal cap.

13. The method of claim 10, further comprising:
    forming a first intermediate metal layer situated between and thermally coupling said first metal cap and said at least one buried via; and
    forming a second intermediate metal layer situated between and thermally coupling said at least one buried via and said second metal cap.

14. The method of claim 10, wherein said first and second metal caps comprise copper.

15. The method of claim 10, further comprising plating an inner surface of said at least one via with a metal barrel.

16. A structure comprising:
    a multilayer substrate having a core and a core thickness, a top surface and a bottom surface;
    a substrate die pad situated on said top surface of said substrate;
    a die fixed to said substrate die pad by an epoxy;
    a heat spreader situated on said bottom surface of said substrate, said substrate further comprising a first metal cap, at least one buried via, and a second metal cap, said first metal cap situated below and thermally coupled to said substrate die pad, said at least one buried via situated below said first metal cap and within said core, said second metal cap situated below said at least one buried via and thermally coupled to said heat spreader, said at least one buried via providing a connection between said substrate die pad and said heat spreaders;

said at least one buried via having a length substantially corresponding to said core thickness.

17. structure of claim 16, wherein said substrate further comprises:

a first intermediate metal layer situated between and thermally coupling said first metal cap and said at least one buried via; and a second intermediate metal layer situated between and thermally coupling said at least one buried via and said second metal cap.

18. The structure of claim 17, wherein said substrate further comprises:

a third layer situated between said substrate die pad and said first intermediate metal layer, said first metal cap occupying a portion of said third layer; and a fourth layer situated between said heat spreader and said second intermediate metal layer, said second metal cap occupying a portion of said fourth layer.

19. The structure of claim 18, wherein at least a portion of each of said core, said third layer and said fourth layer further comprises a dielectric.

20. The structure of claim 1, wherein said first and second metal caps comprise copper.

21. A structure comprising:

a multilayer substrate having a core, a top surface and a bottom surface;

a substrate die pad situated on said top surface of said substrate;

a heat spreader situated on said bottom surface of said substrate, said substrate further comprising a first metal cap, at least one buried via, and a second metal cap, said first metal cap situated below and thermally coupled to said substrate die pad, said at least one buried via situated below said first metal cap and within said core, said second metal cap situated below said at least one buried via and thermally coupled to said heat spreader, said at least one buried via providing a connection between said substrate die pad and said heat spreader;

the substrate further comprising a first intermediate metal layer situated between and thermally coupling said first metal cap and said at least one buried via, a second intermediate metal layer situated between and thermally coupling said at least one buried via and said second metal cap, a third layer situated between said substrate die pad and said first intermediate metal layer, said first metal cap occupying a portion of said third layer, a fourth layer situated between said heat spreader and said second intermediate metal layer! said second metal cap occupying a portion of said fourth layer.

22. A method for fabricating a structure for receiving a semiconductor die, said method comprising steps of:

fabricating a substrate having a core, a top surface and a bottom surface;

forming a substrate die pad on said lop surface of said substrate;

forming a heat spreader on said bottom surface of said substrate;

forming at least one buried via in said core of said substrate;

forming a first metal cap situated below and thermally coupled to said substrate die pad, said first metal cap situated above said at least one buried via;

forming a second metal cap situated below said at least one buried via, said at least one buried via providing a connection between said substrate die pad and said heat spreader:

laminating over said first metal cap with a first laminating material comprising a first resin coated foil layer, thereby causing said first foil layer to directly contact said first metal cap.

23. The method of claim 22, further comprising laminating over said second metal cap with a second laminating material comprising a second resin coated foil layer, thereby causing said second foil layer to directly contact said second metal cap.

* * * * *

UNITED STATES PATENT AND TRADEMARK OFFICE
CERTIFICATE OF CORRECTION

| | |
|---|---|
| PATENT NO. | : 6,787,896 B1 |
| APPLICATION NO. | : 10/438968 |
| DATED | : September 7, 2004 |
| INVENTOR(S) | : Sandra L. Petty-Weeks |

It is certified that error appears in the above-identified patent and that said Letters Patent is hereby corrected as shown below:

In the claims, column 9, line 42, "al" should be changed to --at--.

In the claims, column 9, line 44, "lest" should be changed to --least--.

In the claims, column 9, line 65, "beat" should be changed to --heat--.

In the claims, column 10, line 13, reading "metal barrel" should read --metal-barrel--.

In the claims, column 10, line 30, "spreaders" should be changed to --spreader--.

In the claims, column 11, line 3, "spreaders" should be changed to --spreader--.

In the claims, column 12, line 12, reading "metal layer! said second" should read --metal layer, said second--.

In the claims, column 12, line 18, "lop" should be changed to --top--.

In the claims, column 12, line 30, reading "spreader:" should read --spreader;--.

Signed and Sealed this

Seventeenth Day of July, 2007

JON W. DUDAS
*Director of the United States Patent and Trademark Office*